United States Patent [19]

Wack et al.

[11] Patent Number: 5,401,414
[45] Date of Patent: Mar. 28, 1995

[54] PROCESS FOR RECOVERING A FLUID DISSOLVED IN A RINSING BATH

[75] Inventors: Oskar K. Wack; Martin Hanek, both of Ingolstadt, Germany

[73] Assignee: Dr. O.K. Wack Chemie GmbH, Ingolstadt, Germany

[21] Appl. No.: 95,142

[22] Filed: Jul. 21, 1993

[30] Foreign Application Priority Data

Jan. 27, 1993 [DE] Germany .............. 43 02 115.8
Mar. 15, 1993 [DE] Germany .............. 43 09 096.6

[51] Int. Cl.⁶ ............................................. B01D 61/00
[52] U.S. Cl. ............................ 210/651; 210/652; 210/653; 210/774; 210/805; 210/641; 134/10; 134/12
[58] Field of Search ............... 210/651, 650, 652, 653, 210/654, 770, 180, 181, 774, 805, 641; 202/181; 134/60, 10, 13, 12

[56] References Cited

U.S. PATENT DOCUMENTS

| | | | |
|---|---|---|---|
| 4,131,483 | 12/1978 | Iwahashi et al. | 134/10 |
| 4,156,621 | 5/1979 | Andrews et al. | 134/10 |
| 4,244,506 | 1/1981 | Stokes, Jr. et al. | 210/652 |
| 4,372,788 | 2/1983 | Lancz | 134/22.19 |
| 4,561,940 | 12/1985 | Meier | 202/181 |
| 4,885,095 | 12/1989 | Rich | 210/652 |
| 5,174,315 | 12/1992 | Hellstern et al. | 134/60 |
| 5,183,572 | 2/1993 | Benn | 210/805 |
| 5,194,095 | 3/1993 | Yates | 134/10 |
| 5,194,159 | 3/1993 | George et al. | 210/654 |
| 5,207,919 | 5/1993 | Weaver | 219/651 |

FOREIGN PATENT DOCUMENTS

| | | |
|---|---|---|
| 342800 | 11/1974 | Austria . |
| 523990 | 1/1993 | European Pat. Off. . |
| 1621648 | 7/1971 | Germany . |
| 2423217 | 11/1974 | Germany . |
| 3939222 | 11/1990 | Germany . |
| 4030331 | 3/1992 | Germany . |
| 4123827 | 1/1993 | Germany . |
| 4125891 | 2/1993 | Germany . |

OTHER PUBLICATIONS

Hartlinger: Recycling –Moglichkeiten zur Ruckgewinnung von Losungmitteln und Stoffen, Metalloberflache, vol. 29, May 1975, pp. 221–231.
Hanek, M., Schreinert, R.: FCKW-freie Reinigung, Medien –Anlagen –Konzepte. Galvanotechnik 83, 1992, 4. pp. 1370–1380.
Gutling, Walter, Fischer, Guillermo: Schwankungen vermeiden-Alternative Verfahren zum Verlangern der Standzeiten von Entfettungsbadern. Maschinenmarkt, Wurzburg 94, 1988, 23, p. 52–57.
Derwent Abstracts: Ref. 86–045146/07 to JP 0262-983 A; Ref. 92–418967/51 to JP 04313302A.

*Primary Examiner*—Robert A. Dawson
*Assistant Examiner*—Ana M. Fortuna
*Attorney, Agent, or Firm*—Lalos & Keegan

[57] ABSTRACT

A process isolates, in a closed circulation, the soluble fluid carried over into a rinsing bath from said rinsing bath and to return the fluid into the upstream bath. To this end, enrichment by separating the soluble fluid from the rinsing bath is provided, the enriched fluid, which has been carried over, is returned into the upstream bath together with solvent, where the solvent is separated out with the use of a membrane.

10 Claims, 3 Drawing Sheets

PROCESS FOR RECOVERING A FLUID DISSOLVED IN A RINSING BATH

BACKGROUND OF THE INVENTION

The invention relates to a process for recovering a fluid dissolved in a rinsing bath.

In European Patent Application 92 113 503 there is described a bath comprising glycol ethers for cleaning printed circuit boards which are to be freed of soldering fluxes and/or flux residues. The printed circuit boards are immersed in the glycol ether bath whose cleaning effect can be enhanced by means of ultrasound. The bath is kept at a temperature from approximately 40° to 50° C.

After cleaning, the printed boards are immersed in a second container, in which they are freed of the glycol ethers by means of rinsing water. Owing to the carry-over of glycol ethers into the rinsing water bath in the second container, the concentration of the glycol ethers in the second container gradually increases.

After the rinsing process, the printed boards in the second container can be introduced into a third water container for further cleaning and subsequently be dried in an air stream, preferably in a heated air stream.

The object of this invention is to provide a process for universal use which makes it possible to recover and recycle, in closed circulation, relatively large amounts of fluids carried over into a rinsing bath, even though the fluid is soluble in the rinsing bath.

SUMMARY OF THE INVENTION

According to this invention there is provided a process for the circulation of a mixture of a rinsing liquid bath and a cleaning fluid contained in a first container comprising separating the cleaning fluid from the rinsing bath in a second container, and thereafter returning the separated fluid into the first container.

According to a first preferred embodiment of the invention, it is provided that in the second container the rinsing fluid therein, which is a mixture of the cleaning fluid carried over from the first into the second container, and of the fluid of the rinsing bath, passes through an evaporator, preferably a vacuum evaporator, in which the two fluids are separated from one another on the basis of the different boiling pressure and boiling point. The fluid carried over from the first container is returned thereto, and the rinsing fluid, at the end of the circuit, can flow back once more into the second container.

A second circuit of the rinsing fluid in the second container is provided in which the rinsing fluid, in order to improve the rinsing effect, is circulated with a high flow rate. Into this circuit a water jet pump is introduced to be used, at the same time, to reduce the pressure in the vacuum evaporator. Accordingly, the reduced pressure of the vacuum evaporator is generated without additional energy input, as a waste product, as it were, of the resources available. As a side effect, the air sucked from the vacuum evaporator increases turbulence in the rinsing fluid and thus further enhances the rinsing effect.

In a further embodiment, the efficiency of the vacuum evaporator can be improved by supplying heat at the same time.

It is advantageous to use, in the first container, an ultrasonic generator, which enhances the cleaning effect of the fluid placed in this container. The operation of the ultrasonic generator at the same time leads to the fluid in the first container warming up, and the waste heat produced in the process can be used to assist the evaporation rate in the vacuum evaporator. It is thus possible, in the ideal case, to use the energy, which has been supplied to the overall system, to achieve the separation of the fluid from the rinsing bath.

Purification of the fluid in the first container can preferably be carried out by passing, in a third circuit, the fluid of the first container over a membrane, such as a ceramic membrane. The residues in the fluid of the first container cannot pass the membrane and accumulate in front of it, where they are drawn off. The fluid which has been recovered in the vacuum evaporator and which is to be returned to the first container can now be fed into precisely this third circuit upstream of the membrane, so that the returned fluid, prior to reentry into the first container, passes the membrane and is additionally purified.

For the purpose of reducing the recovery effort, it is advantageous to provide in the second container, instead of a bath containing relatively large amounts of rinsing fluid, a spray device, with the aid of which the fluid from the first bath is rinsed off. The separation effort is thereby markedly reduced, as much smaller amounts have to be subjected to vacuum evaporation.

According to another embodiment of the invention, it is provided that a part of the fluid carried over is recovered from the rinsing bath in a low concentration by membrane technology. A semi-permeable membrane increases the concentration on one side of the membrane in a known manner as a result of osmotic pressure. The original cleaning fluid at a higher concentration thus obtained, but which is still mixed with the solvent of the second container, is returned to the first container, thus deliberately contaminating the first bath with the solvent from the second bath. The contents of the first bath are similarly circulated over a membrane, in order to increase the concentration of the solvent on the far side of the membrane. There, behind the membrane, a carrier fluid is circulated along it, in which said solvent is not soluble. The carrier fluid is used to carry the solvent away, and the solvent—which is not soluble in said fluid—can be separated by decanting. A high concentration of the solvent behind the membrane is thus avoided, and the solvent is able to maintain a continuous flow, as a result of which the solvent is steadily removed from the first bath.

Various membranes are suitable to be used depending upon the composition of the fluids.

A practical application of the invention is the purification, as described in the preamble, of printed circuit boards in a mixture of glycol ethers, the glycol ethers being removed once more from the printed circuit boards downstream in rinsing baths.

BRIEF DESCRIPTION OF THE DRAWINGS

The invention is explained below with reference to the drawing, in which.

DISCUSSION OF THE INVENTION

Figure 1:
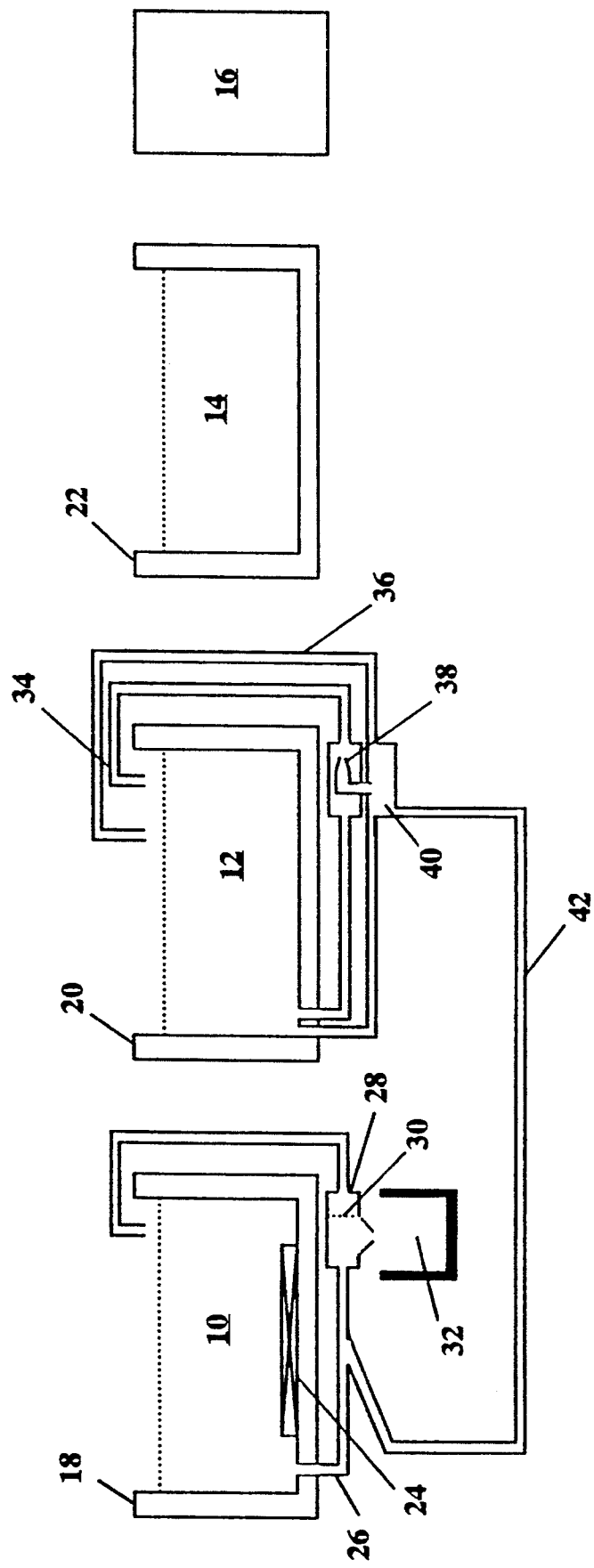
FIG. 1 shows a first installation for the process according to the invention.

FIG. 1 shows a first container 18 in which there is a cleaning fluid 10. In the case of the embodiment described this cleaning fluid is a glycol ether mixture which, depending on the composition, has a boiling point of at least 120° C., up to 220° C. if required.

This glycol ether mixture is preferably a combination of ingredients comprising 10–90% by weight dipropylene glycol monoether of the formula $R_1$—O—CH$_2$—CH(—CH$_3$)—CH$_2$—CH(—OH)—CH$_3$ wherein $R_1$ is a carbon chain of 1–6 carbons, and any one of the following a) 30–70% by weight of N-alkyl lactame wherein the "—N—" atom is substituted with a carbon chain of 1–10 carbons, and b) 10–70% by weight dihydro-2 (3H)-furanone, and c) polypropylene glycol ether of the formula $R_3$—(O—CH(—CH)—CH$_2$—)$_{a=1,2}$—O—$R_4$, wherein $R_3$ is a 1–6 carbon chain and $R_4$ is hydrogen or a carbon chain of 1–6 carbons.

Preferably, the glycol ether mixture is by weight 20% ethoxypropoxypropanol, 50% n-methyl-2-pyrrolidone and 30% n-butoxypropanol. This glycol ether mixture is manufactured commercially for the U.S. by the firm, Dr. O.K. Wack Chemie GmbH, Ingolstadt, Germany under the trademark ZESTRON® A and has an evaporative pressure of 0.9 mbar at 20° C. boiling range 170°–200°C., surface tension 31.7 mN/m density 0.96±0.02 g/cm$^3$ and flash point of 75° C.

Other glycol ether mixtures are set forth in commonly owned companion U.S. patent application titled "Cleaning Agent" executed on Jun. 22 and 23, 1993, Ser. No. 08/092,707 filed Jul. 16, 1993 by the instant inventors, which disclosure is incorporated herein by reference.

Objects to be cleaned can be printed circuit boards which after mounting of semiconductors and electronic components have been soldered and are now to be freed of the soldering fluxes and flux residues. Other fields of application are mechanical or optical parts which are degreased in the bath 10 in the container 18.

An ultrasonic generator 24 is shown, which serves to support the cleaning effect. Its operation leads, as will be further explained below, to heating of the bath 10 due to the energy supplied and reradiated by the generator.

After cleaning of the objects residing in the bath 10 for about 3–5 minutes, though this time is not critical, they are transferred into the container 20 in which there is a rinsing bath 12 again for about 3–5 minutes or as may be desired. In the present case this is water. In the course of the operation, glycol ethers are carried over, together with the objects taken out, into the bath 12 in the container 20. For this reason, a third container 22 is provided which likewise contains a rinsing bath 14, in this case again consisting of water. As this part of the installation, like the drying station 16, is irrelevant for the explanation of the invention, a detailed description of the mode of action of this part has been omitted, reference being made to the European Patent Application 92 113 503 in which a design of this type is shown, and especially the recovery of cleaning fluid via absorber resins is described.

Associated with the container 18 containing the cleaning fluid 10 there is a circuit 26 with the aid of which the cleaning fluid is circulated and is passed over a ceramic membrane 30 in a microfiltration chamber 28. The cleaning fluid 10 can pass the ceramic membrane, the impurities are thus filtered off and, as shown schematically, collected in a container 32 and disposed of.

Figure 2:
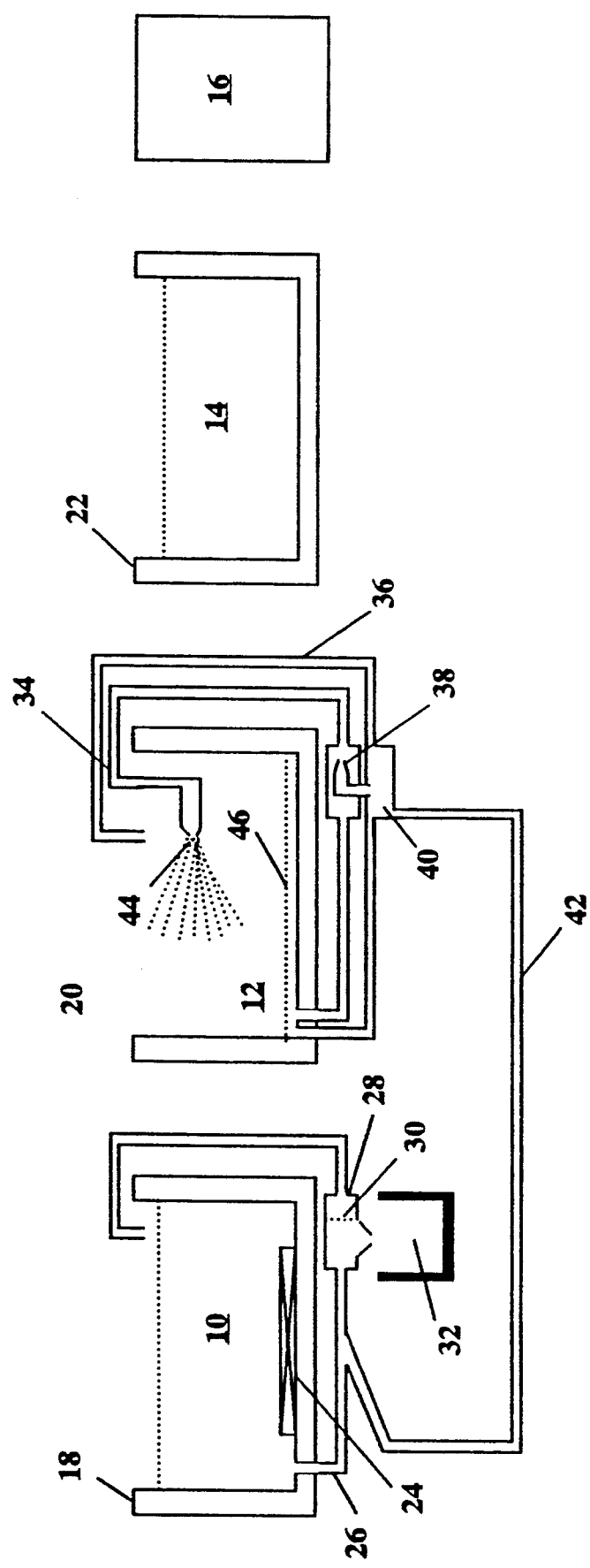
FIG. 2 shows a second embodiment of the installation.
Figure 3:
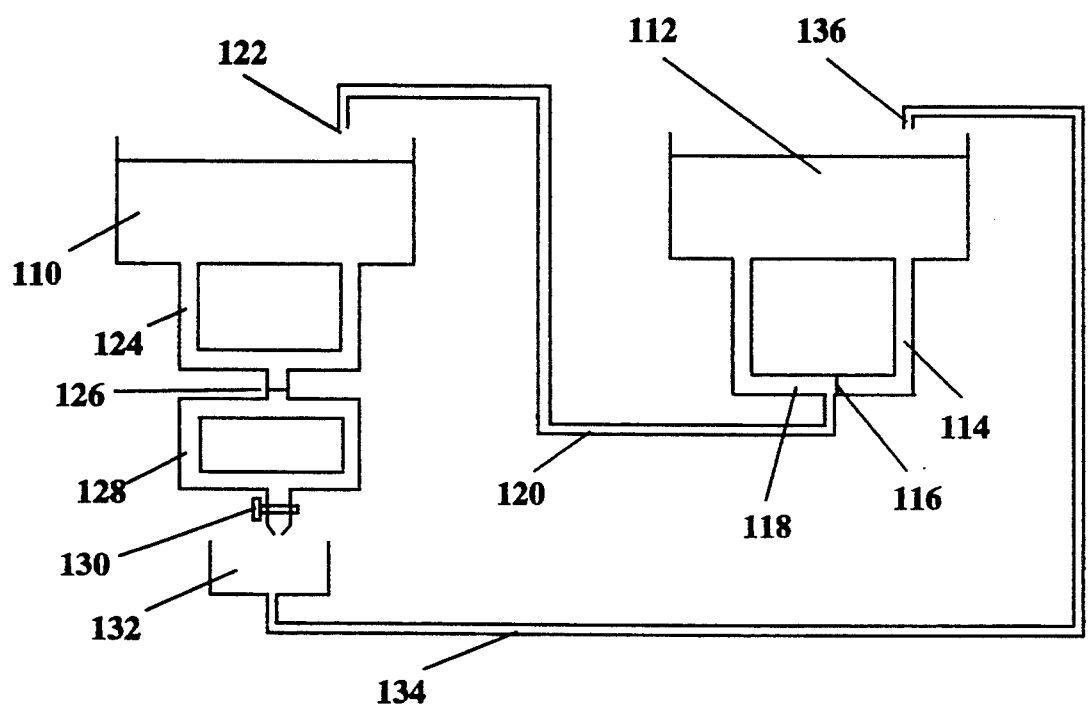
FIG. 3 shows a further embodiment of the invention using different separating means.

Membranes that are suitable for the preferred glycol ether cleaning fluid include a) SiC with a pore width of 0.05 to 0.5 μm as shown at 30 in FIGS. 1 or 2, b) polypropylene, polyamide or polysulfone as shown at 126 in FIG. 3 and polypropylene, polyamide, nanofiltration having a pore width of $5 \times 10^{-4}$ to 0.2 μm.

Circuits are also associated with the container 20 containing the rinsing fluid 12, a circuit 34 serving to circulate the rinsing fluid, as a result of which the cleaning effect is improved and concentrating of the cleaning fluid carried over is avoided. To this end there is associated with the circuit a pump which provides a throughput, in the present case, of approximately 50 l/min. It is thereby possible to circulate the contents of the container 12, amounting to approximately 50 l, once per minute.

A further circuit 36 is provided which serves for the recovery of the cleaning fluid carried over. To this end, in this circuit the contents of the bath 12 are passed through a vacuum evaporator 40. In this evaporator, a reduced pressure of approximately 200 mbar is set which is generated by a water jet pump 38 driven by the circuit 34. As the boiling points of the glycol ether, depending on the composition, are in the range between 120° C. and 230° C. and preferably as with ZESTRON® A about 170° C. to 200° C. the glycol ethers can be separated from the water having a much lower boiling point of 100° C. The water is returned into the container 20 as steam which recondenses, the glycol ethers are taken into the container 18 via a line 42.

This line 42 debouches into the circuit 26 of the first container 18, specifically at a point upstream of the ceramic membrane 30. Thus it is ensured that the dirt which has reached the container 20 and which, like the glycol ethers, remains behind upon evaporation of the water in the vacuum evaporator and, together with the glycol ethers, is returned to the container 18, does not reach the bath 10 but that instead, prior to this, the ceramic membrane 30 in the microfilter station 28 becomes effective and filters out this dirt too.

However, the reduced pressure in the vacuum evaporator is not by itself sufficient to achieve the intended separation, an additional supply of heat being at least desirable. The bath 10 adjusts itself to a temperature from approximately 40° to 50° C. which is optimal for the cleaning effect. As a result of the generation of ultrasound in the generator 24, however, further energy is fed in. This energy may be given off again, for example via a heat exchanger (not shown), and serves to heat the mixture in the circuit 36, thus supporting the evaporation effect at the vacuum evaporator 40.

In a further embodiment of the invention in FIG. 2 it is provided that the circuit 34, which operates with the high throughput mentioned above, at its outlet point has a nozzle 44 from which the rinsing fluid emerges. The objects to be cleaned can be sprayed here, resulting in an enhanced rinsing effect. At the same time, the amount of rinsing bath required is considerably smaller, as indicated by the liquid level 46. Thus the amount of water to be evaporated in the vacuum evaporator for the purpose of separation is markedly less, only about 10 to 20% of the amount according to the embodiment in FIG. 1, so that the separation of cleaning fluid and rinsing fluid can be achieved with much less effort.

Another embodiment using a different technique for separating the mixture contained in the second container is shown in FIG. 3. In a vessel 110 there is a cleaning fluid bath. The cleaning fluid serves to remove residues from electronic printed wiring boards treated in a solder bath. Said cleaning fluid is water soluble. The circuit boards, which have been cleaned in the vessel 110, the cleaning process optionally being enhanced by ultrasonic treatment, are rinsed in a water bath 112 to free the circuit boards of the cleaning fluid and to ensure satisfactory electrical behavior. Eventually, after rinsing has been carried out several times, cleaning fluid is carried over from the cleaning bath 110 into the rinsing bath 112. Said cleaning fluid, which attains a concentration of several percent, in the order of magnitude of up to 5 percent, and more if no measures are taken, is to be removed by the process according to the invention, preferably to produce a concentration of about 2% in the water of the rinsing bath.

To this end, provision is made to circulate the contents of the vessel 112 in a circulation path 114 and, in the process, pass it through a membrane 116. The membrane 116 is semi-permeable and is permeable to the solvent, in this case water, as a result of which an increased concentration of cleaning fluid arises in front of the membrane, although it is still dissolved in water to a considerable degree. Depending on the chemicals involved, concentrations of 30 percent and more can be achieved.

The more highly concentrated mixture of cleaning fluid and water, contained in region 118, is recycled into the first bath via a line 120 through an outlet 122. While this does introduce water into the cleaning fluid, which in itself is undesirable, the proportion of water in the cleaning bath 110 is very small, in an order of magnitude of less than 5%, usually 2% to 5%.

In order to remove the water from the bath 110, a further circulation 124 is provided, by means of which the cleaning fluid with its low water content is passed along a membrane 126. This membrane too is semi-permeable and permeable to water, but not to the cleaning fluid. On the far side of said membrane 126, a carrier fluid insoluble in water, is passed in a circulation 128, so that excessive concentrations of water do not arise behind the membrane, i.e. the water is removed. This carrier liquid may be any liquid that is insoluble or immiscible in water so as to be easily separated may be used. Examples of such useful liquids are mineral oil, silicone, etc.

Because the carrier liquid in circulation 128 does not mix with the water, the water can then be drained by means of a decanter, schematically shown with reference symbol 130, and be collected in a vessel 132, whence it is carried along via a line 134, and through an outlet 136 is returned to the water bath 112.

The further rinsing container and the drying means are not shown in FIG. 3, reference is made to FIGS. 1 or 2.

An important aspect of the process described is the fact that it is thereby possible to recover all of the cleaning fluid carried over and thus to represent a process in which neither does the rinsing fluid, in this case water, have to be renewed, nor are cleaning agents, in this case glycol ethers, given off into the environment. Nor does contaminated water leave the circuit nor does it have to be disposed of. Thus the process is advantageous both ecologically and economically.

We claim:

1. A process for doubly separating a non-aqueous glycol ether containing cleaning fluid from water in a rinsing bath, including a first container containing said cleaning fluid in a high concentration, and a second container containing water as a rinsing fluid forming the rinsing bath with proportions of the cleaning fluid in a lower concentration, the boiling point of water being lower than the boiling point of glycol ether, the process having the combination of steps including:

circulating the rinsing fluid, together with the dissolved proportions of the glycol ether cleaning fluid at a low concentration in a first circuit, firstly separating by vacuum evaporating the dissolved proportions of the glycol ether cleaning fluid from the rinsing fluid circulated in a said first circulation circuit, collecting the glycol ether cleaning fluid obtained from said vacuum evaporation of the circulated rinsing fluid and returning said glycol ether cleaning fluid to the first container, providing for the first container a third circuit in which the glycol ether cleaning fluid in the first container is circulated, secondly separating dissolved water in said glycol ether cleaning fluid in said third circuit by a semi-permeable membrane which allows the glycol ether cleaning fluid to pass and which holds back the water, drawing off the water for disposal, and returning the separated glycol ether cleaning fluid without the dissolved water back to the first container.

2. Process according to claim 1, including, providing a second circuit connected to the second container, circulating the rinsing fluid in said second circuit, providing a water jet pump in said second circuit to provide reduced pressure for vacuum evaporating in the first circuit.

3. Process according to claim 1 including, heating the fluid in the first container and removing the waste heat to support the vacuum evaporating in the first circuit of the second container.

4. Process according to claim 3, including, heating by the generation of ultrasonic waves.

5. Process according to claim 1, wherein the membrane used is a ceramic membrane.

6. Process according to claim 1 including, spraying the rinsing fluid in the second container upon circulation in a second circuit to form a spray jet used for rinsing.

7. Process according to claim 1 wherein the membrane is selected from the group consisting of SiC, polypropylene, polyamide, polysulfone having a pore width of $5 \times 10-4$ to 0.5 $\mu$m.

8. A process for doubly separating a non-aqueous glycol ether containing cleaning fluid from water in a rinsing bath, including a first container containing said cleaning fluid in a high concentration, and a second container containing water as a rinsing fluid forming the rinsing bath with proportions of the cleaning fluid in a lower concentration, the boiling point of the water being lower than the boiling point of the glycol ether, the process having the combination of steps including:

circulating the rinsing fluid, together with the dissolved proportions of the glycol ether cleaning fluid at a low concentration in a first circuit, in said first circuit, passing the rinsing fluid over a membrane, increasing the concentration of said cleaning fluid to said rinsing fluid by means of osmosis at said membrane, returning the more highly concentrate cleaning fluid thus obtained to the first container, in a second circuit circulating the content of the first container through a membrane, removing the rinsing fluid by means of osmosis, retaining the cleaning fluid behind the membrane, in a third circuit carrying away the rinsing fluid by a carrier liquid in which the rinsing fluid is not soluble, removing the rinsing fluid from the carrier liquid, and returning the removed rinsing fluid to the second container.

9. Process according to claim 8, wherein the carrier liquid is a mineral oil or silicone.

10. Process according to claim 8, wherein the membrane used is a polyethylene sheet, a polyamide sheet or a ceramic membrane.

* * * * *